United States Patent
Yoshikawa et al.

(10) Patent No.: US 6,696,636 B2
(45) Date of Patent: Feb. 24, 2004

(54) BY-PASS RECTIFIER ELEMENT AND TERMINAL HOUSING FOR SOLAR BATTERY MODULES USING A BY-PASS RECTIFIER ELEMENT

(75) Inventors: Hiroyuki Yoshikawa, Yokkaichi (JP); Makoto Higashikozono, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 50 days.

(21) Appl. No.: 10/079,548

(22) Filed: Feb. 22, 2002

(65) Prior Publication Data

US 2002/0117200 A1 Aug. 29, 2002

(30) Foreign Application Priority Data

Feb. 23, 2001 (JP) ........................................ 2001-048208

(51) Int. Cl.[7] ........................... H01L 31/05; H01L 31/02; H01L 31/0224
(52) U.S. Cl. ..................... 136/244; 136/251; 136/255; 136/291; 257/750; 257/775; 257/433; 257/431
(58) Field of Search ................................ 136/244, 251, 136/255, 291; 257/750, 775, 433, 431

(56) References Cited

U.S. PATENT DOCUMENTS

| | | | | |
|---|---|---|---|---|
| 4,577,051 A | * | 3/1986 | Hartman | 136/244 |
| 5,330,583 A | * | 7/1994 | Asai et al. | 136/251 |
| 5,391,235 A | * | 2/1995 | Inoue | 136/244 |
| 5,616,185 A | * | 4/1997 | Kukulka | 136/244 |
| 6,103,970 A | * | 8/2000 | Kilmer et al. | 136/252 |
| 6,316,832 B1 | * | 11/2001 | Tsuzuki et al. | 257/747 |

FOREIGN PATENT DOCUMENTS

| | | |
|---|---|---|
| JP | 54-61887 | 5/1979 |
| JP | 3-25031 | 4/1991 |
| JP | 2855299 | 11/1998 |
| JP | 2000-196128 A | * 7/2000 |
| JP | 2000-277785 A | * 10/2000 |

OTHER PUBLICATIONS

English language Abstract for JP 54–61887, May–1979.
English language Abstract for JP 3–25031, Apr.–1991.
English language Abstract for JP 2855299, Nov.–1998.

* cited by examiner

*Primary Examiner*—Alan Diamond
(74) *Attorney, Agent, or Firm*—Greenblum & Bernstein, P.L.C.

(57) ABSTRACT

A by-pass diode includes a first lead plate and a second lead plate respectively arranged on the top face and the bottom face of a rectifier laminate and extending therefrom in opposite directions in parallel relation to each other. The first lead plates is made thinner than the second lead plate. The first lead plate includes a rectangular body portion and a head portion extending from one end face of the rectangular body portion and connected to the rectifier laminate. The head portion further includes a reduced neck portion. The first lead plate has slits in the zone adjacent the head and neck portions connected to the rectifier laminate, the slits being notched deeply width-wise, alternately from each longitudinal side of the rectangular body portion. The by-pass diode is incorporated into a terminal housing for solar battery modules. In such a terminal housing, the link portions connecting the rectifier laminate to the lead plates are prevented from delamination, even under severe use conditions.

19 Claims, 4 Drawing Sheets

PRIOR ART

BY-PASS RECTIFIER ELEMENT AND TERMINAL HOUSING FOR SOLAR BATTERY MODULES USING A BY-PASS RECTIFIER ELEMENT

BACKGROUND OF THE INVENTION

1. Field of the Invention

The present invention generally relates to a by-pass rectifier element and a terminal housing for solar battery modules employing a by-pass rectifier element. In particular, the invention relates to a by-pass rectifier element configured such that it can withstand stresses caused by swelling or shrinkage of structural materials, when used under severe climatic conditions.

2. Description of Related Art

As shown in FIGS. 2 and 6, a known by-pass diode 100 includes a rectifier laminate 101 essentially formed by laminating, from bottom to top, a base lead plate 103, a cathode electrode 101a, an n-type domain layer 101b, a p-type domain layer 101c, an anode electrode 101d, and a top lead plate 105. The base lead plate 103 has a rectangular form, one end portion of which is connected to the cathode electrode 101a at the bottom of the rectifier laminate 101 by soldering. The top lead plate 105 includes a rectangular portion 105a and a head portion 105b which extends outward from one side end of the rectangular portion and is connected to the anode electrode 101d at the top of the rectifier laminate 101 by soldering. Further, the top lead plate 105 and the base lead plate 103 are arranged parallel to each other, but extend in opposite directions from the rectifier laminate 101 (FIG. 2).

The above by-pass diode is incorporated into a terminal housing for solar battery modules 110 as shown in FIG. 1. To mount such a terminal housing, there is first provided a housing 111, made of e.g. a synthetic resin, including a base and sidewalls, the top being left open. The base carries, in parallel, e.g. four lead-frame receiver terminals 113a, 113b, 113c and 113d. A plurality of by-pass diodes 100 are intercalated between the lead-frame receiver terminals 113a to 113d, such that the base lead plate 103 and top lead plate 105 of each by-pass diode are connected respectively to the adjacent lead-frame receiver terminal 113a, 113b, 113c or 113d and soldered thereto. The receiver terminals 113a and 113d located at both ends of the housing 111 are respectively connected, by clamping, to corresponding module-linking cables 117a and 117d, which are led into the housing 111 from outside through two fitting holes 115a and 115d formed in a sidewall of the housing 111.

The base of the housing 111 is further provided with path holes 121a, 121b, 121c and 121d, respectively formed adjacent to the corresponding lead-frame receiver terminals 113a to 113d.

The housing 111 is fitted to a solar battery module (not shown in figures), from which are led out a positive-electrode lead frame 119a and a negative-electrode lead frame 119d. The positive- and negative-electrode lead frames 119a and 119d are led into the housing 111 through e.g. respective ones of the path holes 121a and 121d and connected to the lead-frame receiver terminals 113a and 113d. The housing 111 is then filled with e.g. silicone (not shown in figures).

As described above, the by-pass diodes 100 are placed in a housing 111 made of e.g. synthetic resin and embedded therein with e.g. silicone. However, the housing 111 and silicone swell and shrink repeatedly, each time they are used under severe conditions caused e.g. by steep temperature changes. Repeated swelling and shrinking imparts excessive stresses to the portions of the by-pass diodes 100 linking the base and top lead plates 103 and 105 to the rectifier laminate 101. The link portions can then become detached or the rectifier laminate can become delaminated, thereby causing an electrical break.

Such a phenomenon frequently occurs when a plurality of by-pass diodes 100 are mounted in series.

An object of the present invention is therefore to provide stress-resistant by-pass rectifier elements, which may be used in a terminal housing for solar battery modules. In the rectifier elements of the present invention, the portions thereof linking the lead plates to the rectifier laminate cannot be delaminated or detached, even when the elements are used repeatedly under severe climatic conditions.

Another object of the present invention is to provide a connector housing for solar battery modules incorporating the by-pass rectifier element of the present invention.

SUMMARY OF THE INVENTION

To this end, according to one aspect of the present invention, there is provided a by-pass rectifier element including a rectifier laminate having the form of a chip with first and second faces. The by-pass rectifier element further includes a first lead plate and a second lead plate, each having a longitudinal extension with an end portion, the end portions being arranged respectively on the first face and second face of the rectifier laminate. The first lead plate and the second lead plate extend in parallel in opposite directions, respectively from the first face and second face of the rectifier laminate. In the structure of the present invention, the first lead plate is thinner than the second lead plate.

Preferably, the first lead plate includes a zone adjacent to the end portion, and the zone is provided with slits notched alternately in the direction perpendicular to the longitudinal extension along which the first lead plate extends.

Further, at least one of the first and second lead plates includes a rectangular body portion including short sides and long sides, and the end portion of at least one of the first and second lead plates is formed into a head portion extending from one of the short sides of the rectangular body.

The head portion may include a neck portion having a reduced width with respect to the head portion.

Further, the short side of the rectangular body portion may be grooved at both sides of the neck portion along the long side of the rectangular body.

The invention also relates to a by-pass rectifier element including a rectifier laminate having the form of a chip with first and second faces. The by-pass rectifier element further includes a first lead strip and a second lead strip, each having an end portion respectively arranged on the first face and second face of the rectifier laminate. The first lead strip and the second lead strip extend in parallel along opposite directions, respectively from the first face and second face of the rectifier laminate.

At least one of the first and second lead strips may include an elongated rectangular body portion including short sides and long sides.

The end portion of the at least one of the first and second lead strips is formed into a head portion extending from one of the short sides of the elongated rectangular body portion, and the elongated rectangular body portion has a width narrower than that of the head portion and extends therefrom.

Preferably, the first lead strip is thinner than the second lead strip.

The invention further relates to a terminal housing incorporating a by-pass rectifier element for solar battery modules. The by-pass rectifier element includes a rectifier laminate having the form of a chip with first and second faces. The by-pass rectifier element further includes a first lead plate and a second lead plate, each having an end portion arranged on the first face and second face of the rectifier laminate, respectively. The first lead plate and the second lead plate extend in parallel along opposite directions, respectively, from the first face and second face of the rectifier laminate, wherein the first lead plate is thinner than the second lead plate. The housing further includes a container mounted into the solar battery module; a plurality of lead-frame receiver terminals arranged in the container and connected to positive and negative electrode lead frames extending from the solar battery module; a pair of module-linking cables for a power source, one end of which is connected to one of the lead-frame receiver terminals, and the other end of which is drawn towards the outside of the container; and wherein each of the first and second lead plates is intercalated or positioned between corresponding lead-frame receiver terminals so that it is electrically connected thereto.

The invention also relates to a terminal housing incorporating a by-pass rectifier element for solar battery modules. The by-pass rectifier element includes a rectifier laminate having the form of a chip with first and second faces. The by-pass rectifier element further includes a first lead strip and a second lead strip each having an end portion arranged on the first face and second face of the rectifier laminate, respectively, the first lead strip and the second lead strip extending in parallel along opposite directions, respectively, from the first face and second face of the rectifier laminate.

Further, at least one of the first and second lead strips includes an elongated rectangular body portion including short sides and long sides; an end portion of the at least one of the first and second lead strips is formed into a head portion extending from one of the short sides of the elongated rectangular body portion, the elongated rectangular body portion having a width narrower than that of the head portion and extending therefrom.

The terminal housing further includes: a container mounted into the solar battery module; a plurality of lead-frame receiver terminals arranged in the container and connected to positive and negative electrode lead frames extending from the solar battery module; a pair of module-linking cables for a power source, one end of which is connected to one of the lead-frame receiver terminals, and the other end of which is positioned outside of the container; and wherein each of the first and second lead strips is intercalated or positioned between corresponding lead-frame receiver terminals so that it is electrically connected thereto.

Typically, the first lead strip is thinner than the second lead strip.

BRIEF DESCRIPTION OF THE DRAWINGS

The above, and the other objects, features and advantages of the invention are made apparent from the following description of the preferred embodiments, given as non-limiting examples, with reference to the drawings, in which.

DETAILED DESCRIPTION OF THE PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The terminal housing device for solar battery modules according to a first embodiment of the invention is described with reference to FIGS. 3 to 6.

Figure 1:
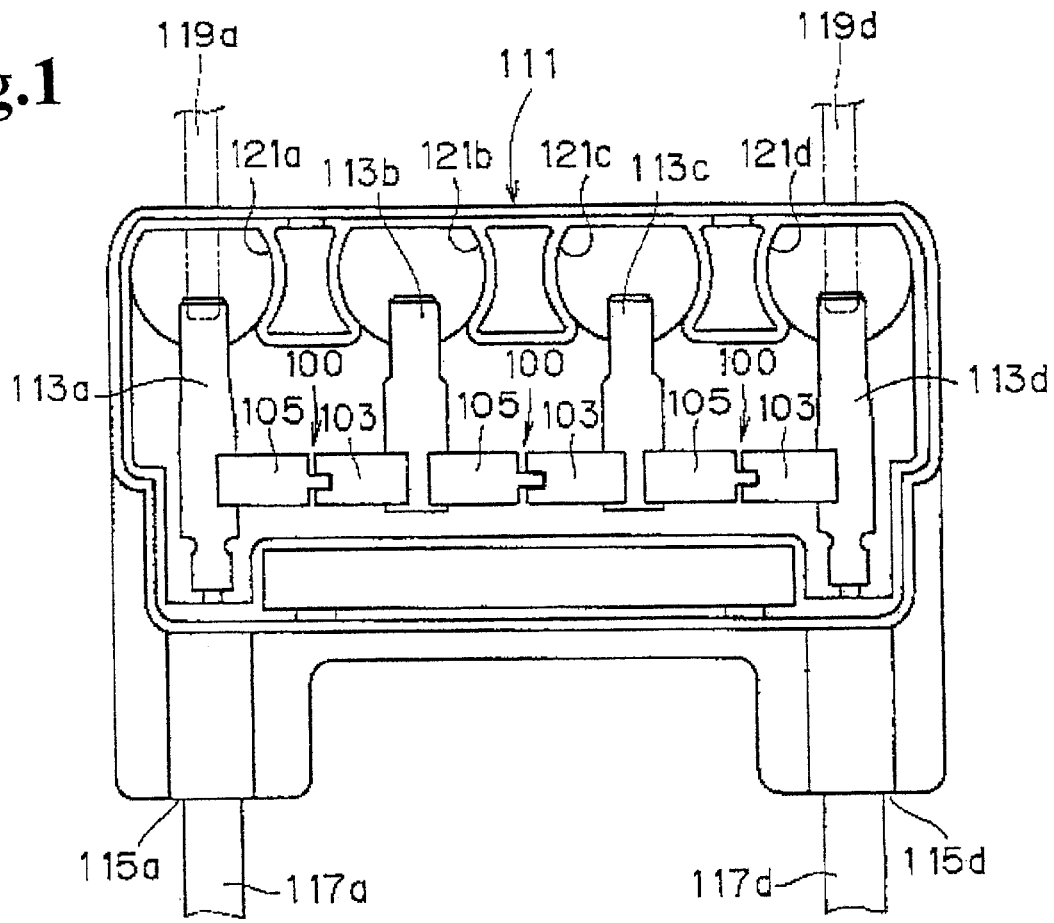
FIG. 1 is a schematic top plan view of a terminal housing for solar battery modules according to the prior art.
Figure 2:
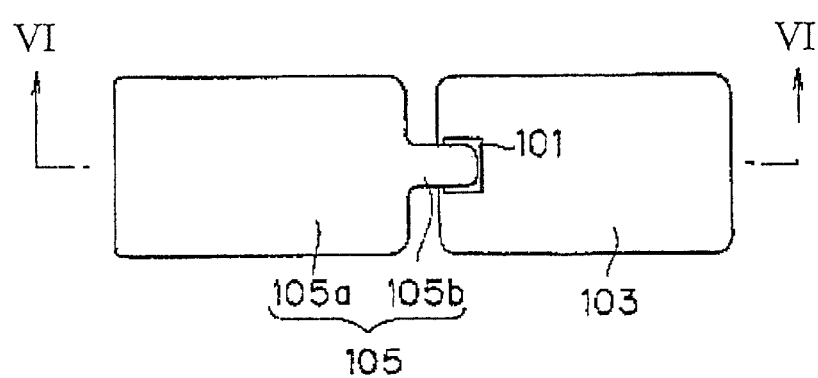
FIG. 2 is a top plan view of a by-pass diode used in the prior art terminal housing for solar battery modules.
Figure 3:
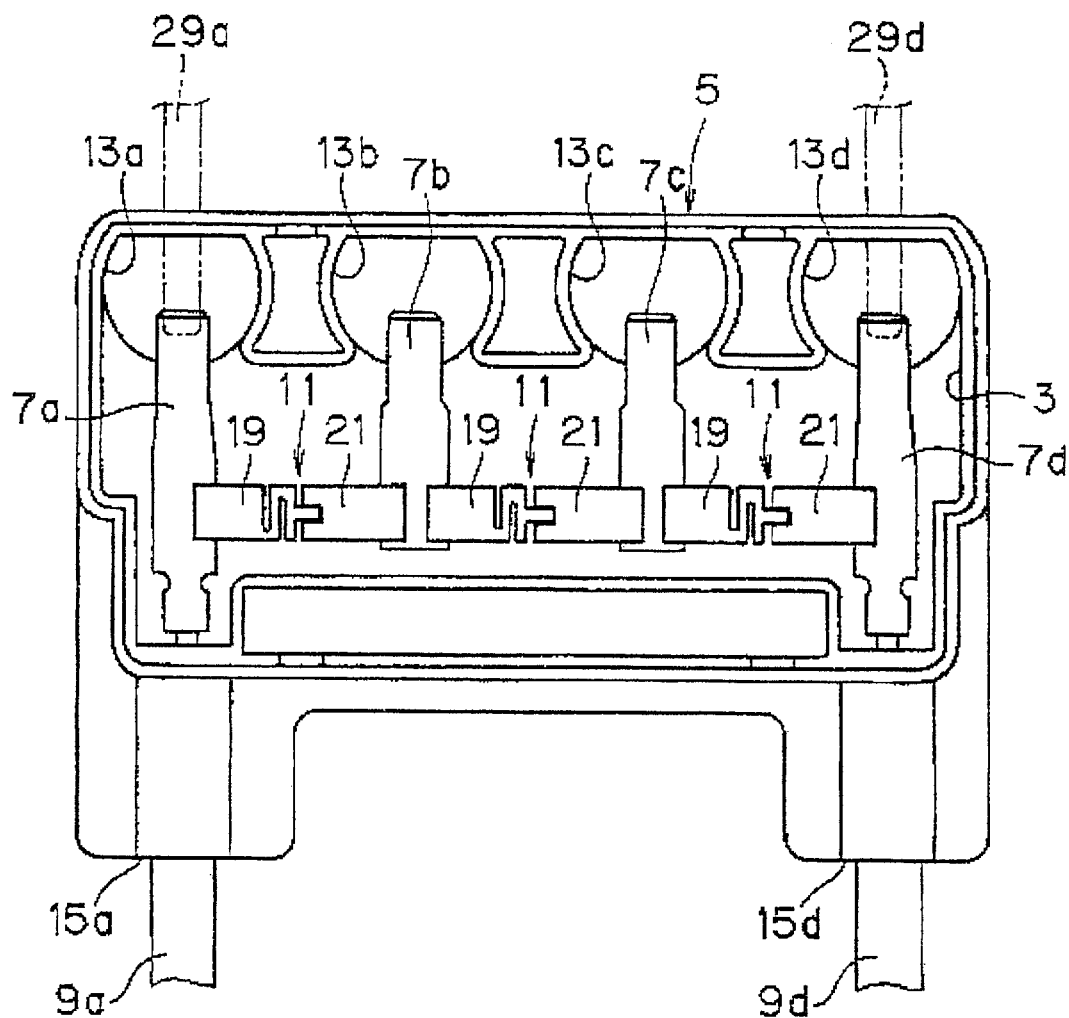
FIG. 3 is a schematic top plan view of a terminal housing device for solar battery modules according to a first embodiment of the invention.

As shown in FIG. 3, the terminal housing device for solar battery modules 1 (or terminal housing 1) is in the form of a container 5 having any suitable shape such as, for example, rectangular, with a rectangular base and sidewalls, its top face being open. The container 5 is formed of any suitable material such as, for example, a synthetic resin and has a container enclosure 3. The container enclosure 3 may include any number of lead-frame receiver terminals, and in the present embodiment includes four lead-frame receiver terminals 7a, 7b, 7c and 7d, a pair of module-linking cables 9a and 9d connecting to a power source, and three by-pass rectifier elements 11. The by-pass rectifier elements 11 may be, for example, by-pass diodes.

The rectangular base of the container 5 provides lead-frame path holes 13a, 13b, 13c and 13d along one of the long sides of the container's rectangular base. The sidewall rising from the other long side of the container's rectangular base is provided with module-linking cable fitting holes 15a and 15d (or cable fit holes) each having a cylindrical form. The cable fit holes 15a and 15d are placed at positions opposite the lead-frame path holes 13a and 13d.

The lead-frame receiver terminals 7a, 7b, 7c and 7d are positioned adjacent the corresponding lead-frame path holes 13a, 13b, 13c and 13d on the rectangular base of the container 5. These lead-frame receiver terminals 7a, 7b, 7c and 7d may be held by any suitable pinching device such as, for example, a pair of hooks (not shown in figures) provided on the rectangular base of the container 5.

A first end of each of the module-linking cables 9a and 9d is led out from the container 5, and a second end thereof is led into the container 5 through the corresponding cable fit holes 15a and 15d and electrically connected to the lead-frame receiver terminals 7a and 7d by clamping.

In each of the by-pass diodes 11, each group of first and second lead plates 19 and 21 is placed between the corresponding lead-frame receiver terminals 7a, 7b, 7c and 7d, and is electrically connected thereto by any suitable connecting device such as, for example, soldering.

Figure 4:
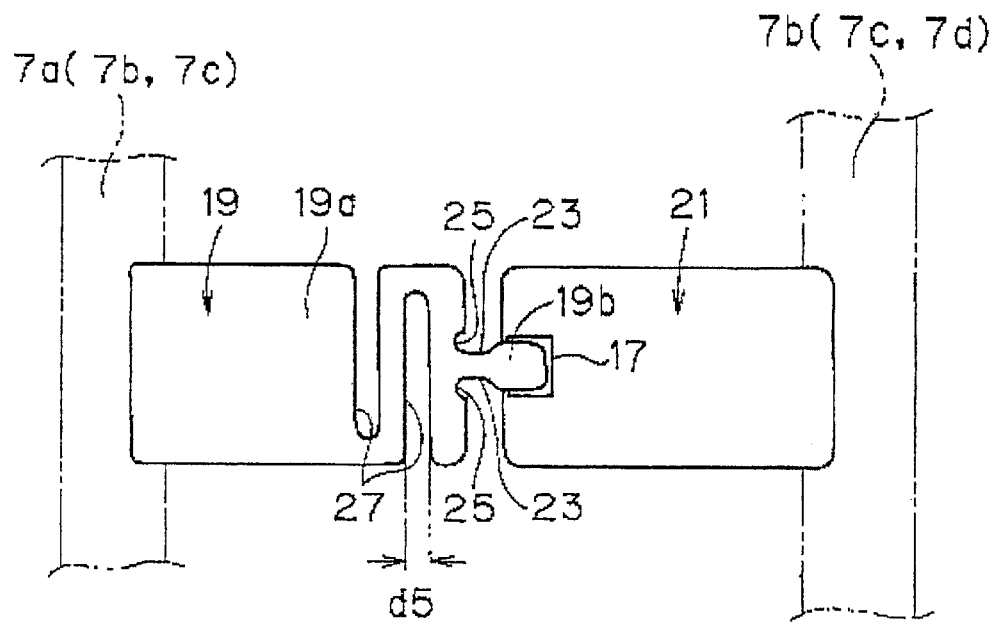
FIG. 4 is a top plan view of a by-pass diode used in the terminal housing device for solar battery module according to the first embodiment of the invention.
Figure 5:
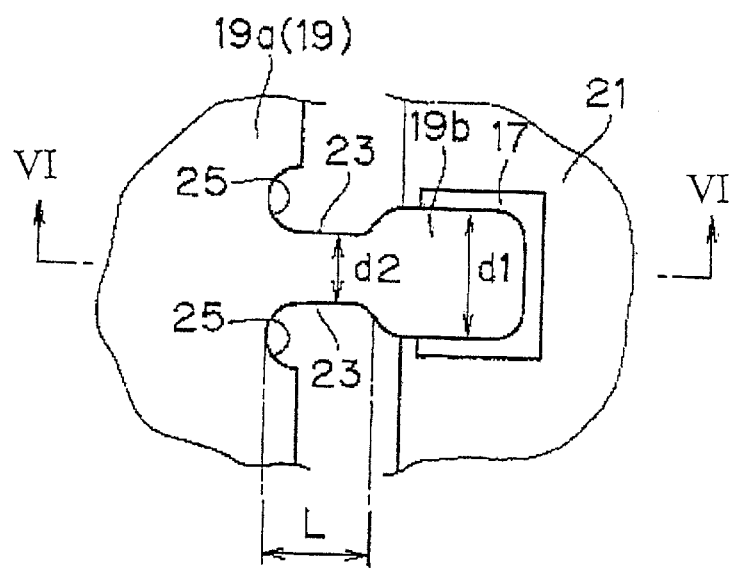
FIG. 5 is a partially enlarged top plan view of the by-pass diode used in the terminal housing device for solar battery modules of FIG. 4.
Figure 6:
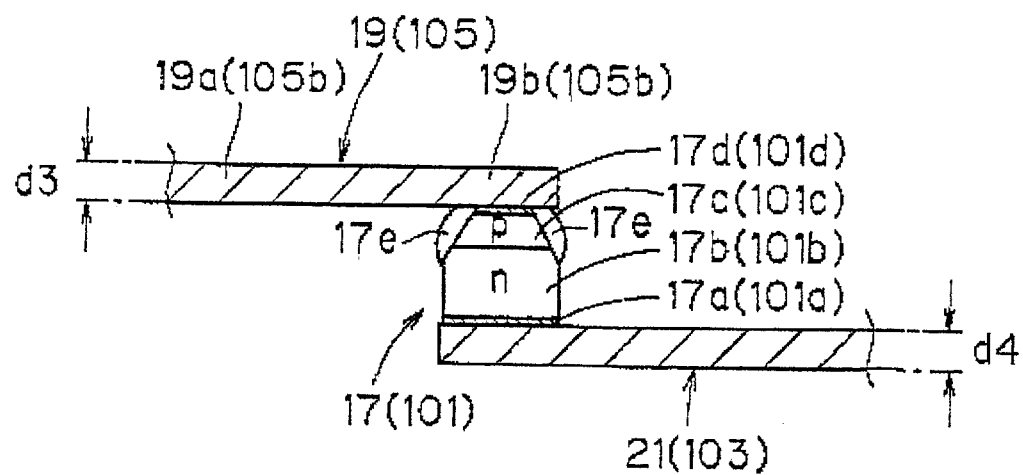
FIG. 6 is a partial cross-sectional view taken along line VI—VI in FIG. 2 and FIG. 5.

As shown in FIGS. 4 to 6, each by-pass diode 11 includes a rectifier laminate 17 which may take any form and in the present embodiment is in the form of a substantially square-shaped chip, viewed from the top or bottom thereof; a first lead plate 19, placed, for example, on the top side of the rectifier laminate 17; and a second lead plate 21, placed, for example on the bottom side of the rectifier laminate 17. Each plate may be made of any suitable conductive material, such as, for example, copper. Each plate may have a substantially rectangular shape, and extend in parallel in opposite directions to each other.

Each rectifier laminate 17 is formed by laminating, for example, from bottom to top, for example a cathode electrode 17a, n-type domain material 17b, p-type domain material 17c and an anode electrode 17d, so as to yield a substantially trapezoidal shape. The n-type domain material and the p-type domain material form an n-p contact plane therebetween and a corresponding side face surrounding this plane. The side face surrounding the contact plane is coated with glass material 17e and is thus passivated. The anode electrode 17d is electrically connected in a suitable manner such as, for example, by soldering, to a longitudinal end portion of the first lead plate 19 from below, whereas the cathode electrode 17a is electrically connected in a suitable manner such as, for example, by soldering, to a longitudinal end portion of the second lead plate 21 from above. In both cases, soldering (connecting) points are preferably set at the middle along the width of the longitudinal end portions on the first and second lead plates 19 and 21.

As shown in FIGS. 4 and 5, the first lead plate 19 includes a substantially rectangular body portion 19a, and a head portion 19b which is formed into a substantially rectangular shape having about the same width d1 as that of the top face of the rectifier laminate 17. The head portion 19b extends horizontally from the longitudinal end portion of the rectangular body portion 19a. The bottom face of the head portion 19b is thus connected to the top face of the rectifier laminate 17, i.e. the anode electrode 17d.

Preferably, both sides of the head portion 19b are narrowed or reduced so as to form a neck portion 23. The by-pass diode 11 can thus be flexed easily via the neck portion 23. This flexing deformation of the neck portion 23 absorbs the stress exerted on the portion connecting the rectifier laminate 17 to the first and second lead plates 19 and 21, and prevents detachment or delamination of this connecting portion. The width d2 of the neck portion 23 is preferably made sufficiently narrow for flexing. When the head portion 19b has a width d1 of about 1.5 mm, the neck portion 23 may have a width d2 of about 0.7 mm.

The shoulder portions, linking the neck portion 23 to the longitudinal end portion of the rectangular body portion 19a, may be notched into any form, and in the present embodiment are notched into arc-shaped recesses 25. Thus, the length L of the neck portion 23 is effectively increased by the depth of these recesses 25, so that the neck portion 23 becomes further flexible. The protection of the portion connecting the rectifier laminate 17 to the first and second lead plates 19 and 21 is thus further reinforced, and its laminated structure is prevented from becoming detached or delaminated. As can be understood from the foregoing, the effective length L of the neck portion 23 is designed preferably to be as great as possible. In the present embodiment, the effective length L of the neck portion 23 is set to be at least 1.0 mm.

With reference to FIG. 6, the thickness d3 of the first lead plate 19 may be made thinner than the thickness d4 of the second lead plate 21. In such case, the first lead plate 19 as a whole is rendered further flexible inside the by-pass diode 11, and can absorb the stress imparted to the above-mentioned connecting portion, thereby preventing the detachment or delamination of this connecting portion. In particular, when thicknesses d3 and d4 are substantially different, better results can be expected: for instance, d3 and d4 may be set at about 0.1 mm and about 0.2 mm, respectively, to obtain a satisfactory result.

With reference to FIG. 4, the rectangular body portion 19a of the relatively thinner first lead plate 19 includes a zone adjacent the head portion 19b, where a series of slits 27 are cut inwardly at right angles, alternately from each longitudinal edge rim of the rectangular body portion 19a.

The by-pass diode 11 is thus rendered more flexible and bendable by the above slit zone. Accordingly, the flexing deformation of this slit zone further relieves the stress exerted on the portion connecting the rectifier laminate 17 to the first and second lead plates 19 and 21, and prevents the detachment of the head portion 19b and the rectifier laminate 17. Preferably, the slit zone is placed near the head portion 19b, and the slits 27 are cut to have a width d5 as narrow as possible. For instance, the width d5 may be about 0.7 mm.

The by-pass diode 11 thus prepared is placed between the lead-frame receiver terminal 7a, 7b, 7c or 7d, so that the rectifying direction is arranged in line, and each group consisting of the first lead plate 19 and the second lead plate 21 is electrically connected to the corresponding lead-frame receiver terminals 7a, 7b, 7c and 7d.

The container 5 is fitted to a solar battery module (not shown in figures). The lead frames 29a and 29b of the respective positive and negative electrodes extending from the above module are drawn into the container 5 through any suitable device, such as, for example, the frame fitting holes 13a and 13d positioned near the lead-frame receiver terminals 7a and 7d, so that the lead frame receiver terminals 7a and 7d, placed at both ends of the container 5, are electrically connected. The container 5 is then filled with any suitable material such as, for example, silicone.

In the terminal housing 1 constructed as above, the first lead plate 19 of the by-pass diode 11 includes a head portion 19b, the root of which is formed into a neck portion 23. The first lead plate 19 (thickness d3) is thinner than the second lead plate 21 (thickness d4). That zone of the rectangular body portion 19a in the thinner first lead plate 19, which is adjacent the head portion 19b, is notched into slits 27. The first lead plate 19 is thus made flexible and easily bendable. As a result, when the first lead plate 19 is flexed, the resulting flexing deformation can absorb the stress exerted on the portion connecting the rectifier laminate 17 to the first and second lead plates 19 and 21. When the terminal housing 1 is repeatedly used under severe conditions such as conditions caused by for example drastic temperature change, the by-pass diodes 11 wired therein may be subjected to the swelling and shrinking of the resin-made container 5 and the silicone contained in the container 5. In particular, the link portions between the rectifier laminate 17 and the first and second lead plates 19 and 21 may be placed under severe stress. Nonetheless, the link portions of the by-pass diode 11 configured as above can resist such forces. The link portions and the rectifier laminate 17 are thus prevented from detachment, delamination, or degradation, and the risk of a subsequent electrical cut or short can be avoided. In particular, even if the chip size of the rectifier laminate is small (having a small soldered area), the above connecting portion can be efficiently protected from detachment, delamination or degradation.

In the first embodiment described above, the first lead plate 19 of the by-pass diode 11 is positioned at the top side of the rectifier laminate 17 and includes a rectangular body portion 19a, a head portion 19b extending therefrom, and/or a neck portion 23 formed near the head portion 19b. The second lead plate 21 is then placed at the bottom side of the rectifier laminate 17 and formed into a rectangular shape. However, such configuration can be interchanged between the first and second lead plates 19 and 21. Moreover, both lead plates 19 and 21 may be provided with corresponding rectangular body portions 19a, head portions 19b and/or neck portions 23. Such alternative embodiments can yield the same results as the first embodiment.

In the by-pass diode 11 of the first embodiment, the first lead plate 19 is made thinner than the second lead plate 21 (d3<d4), and the former 19 is further provided with slits 27, a head portion 19b and a narrowed neck portion 23. Consequently, the first lead plate 19 is more flexible and bendable than the second lead plate 21. As a result, the stress exerted on the link portions connecting the upper lead plate 19 to the rectifier element body 17 can be neutralized, and the above link portions are efficiently prevented from detachment. If, in particular, the protection for the link portion between the second lead late 21 and the rectifier laminate 17 is desirable, the second lead plate 21 may be made thinner than the first lead plate 19, and the former 21 may be further provided with slits 27, a head portion 19b and/or a neck portion 23.

Figure 7:
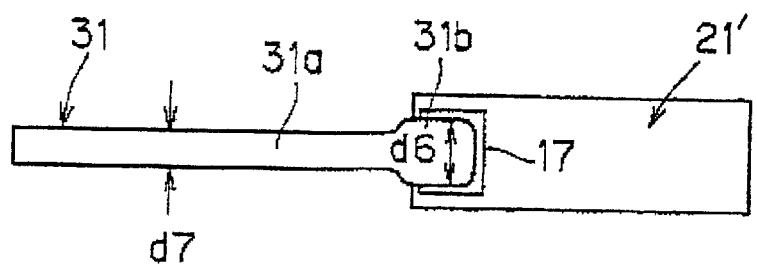
FIG. 7 is a top plan view of a variant by-pass diode used in the terminal housing device for solar battery modules according to a second embodiment of the invention.

FIG. 7 shows a second embodiment of a variant by-pass diode 11A, which may be used instead of the by-pass diode 11 according to the first embodiment. In the second embodiment, the first lead plate 19 is replaced by a first lead strip 31 including a strip body portion 31a and a head portion 31b having width d6, and the second lead plate 21 is replaced by a second lead strip 21'. The head portion 31b has a size about the same as that of the top surface of the rectifier laminate 17 placed underneath. The strip body portion 31a has an elongated rectangular shape with width d7 that is narrower than d6. The strip body portion 31a extends from one end of the head portion 31b.

As the width d7 of the strip body portion 31a is narrower than the width d6 of the head portion 31b, the by-pass diode 11A can be easily flexed or bent. The stress exerted on the link portions between the rectifier laminate 17 and the lead strips 21 and 31 can thus be absorbed by the flexing deformation of the strip body portion 31a. The above link portions, and subsequently the rectifier laminate 17, can thus be prevented efficiently from delamination or detachment.

According to a first aspect of the invention, a pair of lead plates are arranged respectively on the top face and the bottom face of the rectifier laminate, one of the lead plates being made thinner than the other.

In this manner, the by-pass rectifier element is rendered flexible and bendable, by virtue of the thinner-shaped lead plate. In particular, the stress exerted on the link portions between the rectifier laminate and the lead plates is absorbed by the flexing deformation of the entire lead plate having a thinner shape. The link portions are thus prevented from delamination or detachment.

According to a second aspect of the invention, the thinner lead plate is provided with slits in proximity of the head portion connecting to the rectifier laminate, the slits being notched deeply width-wise, alternately from each longitudinal side of the rectangular body portion.

The by-pass rectifier element is thus made flexible and bendable in an area near the position where the rectifier laminate is connected. The flexing deformation of this area neutralizes the stress exerted on the link portions between the rectifier laminate and the lead plate, and detachment of the these portions is efficiently prevented.

According to a third aspect of the invention, at least one of the lead plates includes a rectangular body portion, and a head portion extending from a short side of the rectangular body portion, the head portion including a reduced neck portion.

The by-pass rectifier element is likewise rendered flexible and bendable through the above neck portion. In particular, the flexing deformation of the neck portion absorbs the stress exerted on the link portion between the rectifier laminate and the lead plate. Hence, the anti-detachment effect for the link portions is improved.

According to a fourth aspect of the invention, a pair of lead plates are arranged on the top face and the bottom face, respectively, of the rectifier laminate, and at least one of the lead plates includes a rectangular body portion, and a head portion extending from a short side of the rectangular body portion and connecting to the rectifier laminate, the head portion including a reduced neck portion. The rectangular body portion further includes shoulder portions at the base of the neck portion, and these shoulder portions are grooved into recesses.

Accordingly, the neck portions are further lengthened, and the by-pass rectifier element is rendered more flexible and bendable through the lengthened neck portion. The flexing deformation of the neck portion thus allows absorption of the stress formed on the link portions between the rectifier laminate and the lead plate, and the link portion is prevented from delaminating.

According to a fifth aspect of the invention, a pair of lead strips are respectively arranged on the top face and the bottom face of the rectifier laminate, and at least one of the lead strips includes a head portion connecting to the rectifier laminate, and a strip body portion. The strip body portion has a width narrower than that of the head portion, and extends from a side edge of the latter.

In this manner, the by-pass rectifier element is made flexible and bendable through the narrow strip body portion. The stress imparted to the portions linking the rectifier laminate to the lead strips can be absorbed by the flexing deformation of the strip body portion, and the link portions are protected from detachment or delamination.

According to a sixth aspect of the invention, the terminal housing device incorporates a by-pass rectifier element for solar battery modules as defined above.

Further, the terminal housing device includes a container formed of a synthetic resin. Such a container may be filled with silicone. Accordingly, when the terminal housing device is repeatedly subjected to severe conditions, for example, to drastically varying temperature environments, the resin container and silicone may swell and shrink. However, even under such conditions, the link portion incorporated in the by-pass diode is prevented from detachment and subsequent electrical cut or breakage. The terminal housing device of the invention is thus protected by the stress-easing configuration of the above by-pass diode.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

The present disclosure relates to subject matter contained in priority Japanese Patent Application No. 2001-048208, filed on Feb. 23, 2001, which is herein expressly incorporated by reference in its entirety.

What is claimed:

1. A by-pass rectifier element comprising: a chip-shaped rectifier laminate with first and second faces, the by-pass rectifier element further comprising a first lead plate and a second lead plate, each said first and second lead plate having a longitudinal extension with a first end portion, said first end portions being positioned on the first face and second face of the laminate, respectively, the first lead plate and the second lead plate extending in parallel and in opposite directions from the first face and second face of the rectifier laminate, respectively, wherein said first lead plate is thinner than said second lead plate; and each said first and second lead plate further including a second end portion opposite said first end portion, each said second end portion being configured for electrical connection to a corresponding lead-frame receiver terminal.

2. The by-pass rectifier element according to claim 1, wherein said first lead plate comprises a zone adjacent to said first end portion thereof, and said zone is provided with slits notched alternately in a direction perpendicular to the longitudinal extension along which said first lead plate extends.

3. The by-pass rectifier element according to claim 1, wherein at least one of said first and second lead plates comprises a rectangular body portion including short sides and long sides, and said first end portion of said at least one of said first and second lead plates is formed into a head portion extending from one of said short sides of said rectangular body portion.

4. The by-pass rectifier element according to claim 2, wherein at least one of said first and second lead plates comprises a rectangular body portion including short sides and long sides, and said first end portion of said at least one of said first and second lead plates is formed into a head portion extending from one of said short sides of said rectangular body portion.

5. The by-pass rectifier element according to claim 3, wherein said head portion comprises a neck portion having a reduced width dimension with respect to said head portion.

6. The by-pass rectifier element according to claim 4, wherein said head portion comprises a neck portion having a reduced width dimension with respect to said head portion.

7. The by-pass rectifier element according to claim 5, wherein said short side of said rectangular body portion is grooved at both sides of said neck portion along said long side of said rectangular body portion.

8. The by-pass rectifier element according to claim 6, wherein said short side of said rectangular body portion is grooved at both sides of said neck portion along said long side of said rectangular body portion.

9. A by-pass rectifier element comprising a chip shaped rectifier laminate having first and second faces, the by-pass rectifier element further comprising a first lead strip and a second lead strip, each said first and second lead strip having an end portion positioned on the first face and second face of the rectifier laminate, respectively, the first lead strip and the second lead strip extending in parallel and in opposite directions, from the first face and second face of the rectifier laminate, respectively;

at least one of said first and second lead strips comprises an elongated rectangular body portion including short sides and long sides;

said end portion of said at least one of said first and second lead strips includes a head portion extending from one of said short sides of said elongated rectangular body portion, said elongated rectangular body portion having a width narrower than that of said head portion and extending therefrom.

10. The by-pass rectifier element according to claim 9, wherein said first lead strip is thinner than said second lead strip.

11. A terminal housing incorporating a by-pass rectifier element for solar battery modules, said by-pass rectifier element comprising a chip shaped rectifier laminate with first and second faces, the by-pass rectifier element further comprising a first lead plate and a second lead plate, each said first lead plate and second lead plate having a longitudinal extension with an end portion, said end portions being positioned on the first face and second face of the rectifier laminate, respectively, the first lead plate and the second lead plate extending in parallel and in opposite directions, from the first face and second face of the rectifier laminate, respectively, wherein said first lead plate is thinner than said second lead plate; said terminal housing further comprising:

a container mounted into a solar battery module;

a plurality of lead-frame receiver terminals arranged in said container and connected to positive and negative electrode lead frames extending from said solar battery module;

a pair of module-linking cables for a power source, one end of each module-linking cable being connected to one of said lead-frame receiver terminals, and the other end of each module-linking cable being positioned outside of said container; and wherein each of said first and second lead plates is positioned between corresponding lead-frame receiver terminals and electrically connected thereto.

12. A terminal housing incorporating a by-pass rectifier element for solar battery modules, said by-pass rectifier element comprising a chip shaped rectifier laminate having first and second faces, the by-pass rectifier element further comprising a first lead strip and a second lead strip, each of said first lead strip and said second lead strip having an end portion arranged on the first face and second face of the rectifier laminate, respectively, the first lead strip and the second lead strip extending in parallel and in opposite directions, from the first face and second face, respectively, of the rectifier laminate;

at least one of said first and second lead strips including an elongated rectangular body portion including short sides and long sides;

at least one of said end portions of said first and second lead strips being formed into a head portion extending from one of said short sides of said elongated rectangular body portion, said elongated rectangular body portion having a width narrower than that of said head portion and extending therefrom, said terminal housing further comprising:

a container mounted in a solar battery module;

a plurality of lead-frame receiver terminals arranged in said container and connected to positive and negative electrode lead frames extending from said solar battery module;

a pair of module-linking cables for a power source, one end of each module-linking cable being connected to one of said lead-frame receiver terminals, and the other end of each module-linking cable being positioned outside of said container; and wherein each of said first and second lead strips is positioned between corresponding lead-frame receiver terminals and electrically connected thereto.

13. The terminal housing according to claim 12, wherein said first lead strip is thinner than said second lead strip.

14. A by-pass rectifier element comprising: a chip-shaped rectifier laminate with first and second faces, the by-pass rectifier element further comprising a first lead plate and a second lead plate, each said first and second lead plate having a longitudinal extension with an end portion, said end portions being positioned on the first face and second face of the laminate, respectively, the first lead plate and the second lead plate extending in parallel and in opposite directions from the first face and second face of the rectifier laminate, respectively, wherein said first lead plate is thinner than said second lead plate;

wherein said first lead plate comprises a zone adjacent to said end portion thereof, and said zone is provided with slits notched alternately in a direction perpendicular to the longitudinal extension along which said first lead plate extends.

15. The by-pass rectifier element according to claim 14, wherein at least one of said first and second lead plates comprises a rectangular body portion including short sides and long sides, and said end portion of said at least one of said first and second lead plates is formed into a head portion extending from one of said short sides of said rectangular body portion.

16. The by-pass rectifier element according to claim 15, wherein said head portion comprises a neck portion having a reduced width dimension with respect to said head portion.

17. The by-pass rectifier element according to claim 16, wherein said short side of said rectangular body portion is grooved at both sides of said neck portion along said long side of said rectangular body portion.

18. A by-pass rectifier element comprising: a chip-shaped rectifier laminate with first and second faces, the by-pass rectifier element further comprising a first lead plate and a second lead plate, each said first and second lead plate having a longitudinal extension with an end portion, said end portions being positioned on the first face and second face of the laminate, respectively, the first lead plate and the second lead plate extending in parallel and in opposite directions from the first face and second face of the rectifier laminate, respectively, wherein said first lead plate is thinner than said second lead plate;

wherein at least one of said first and second lead plates comprises a rectangular body portion including short sides and long sides, and said end portion of said at least one of said first and second lead plates is formed into a head portion extending from one of said short sides of said rectangular body portion; and wherein said head portion comprises a neck portion having a reduced width dimension with respect to said head portion.

19. The by-pass rectifier element according to claim 18, wherein said short side of said rectangular body portion is grooved at both sides of said neck portion along said long side of said rectangular body portion.

* * * * *